United States Patent [19]

Nelson et al.

[11] Patent Number: 5,535,094
[45] Date of Patent: Jul. 9, 1996

[54] INTEGRATED CIRCUIT PACKAGE WITH AN INTEGRAL HEAT SINK AND FAN

[75] Inventors: Daryl J. Nelson, Beaverton; Muralidhar Tirumala, Portland; Peter Butler, Hillsboro; Gerald A. Budelman, Aloha, all of Oreg.

[73] Assignee: Intel Corporation, Santa Clara, Calif.

[21] Appl. No.: 429,079

[22] Filed: Apr. 26, 1995

[51] Int. Cl.[6] .................................................. H05K 7/20
[52] U.S. Cl. .................... 361/697; 165/80.3; 165/122; 257/722
[58] Field of Search ............................. 310/62–64, 68 C; 415/175–178, 213.1; 361/688, 690, 694, 695, 697; 174/16.1, 16.3; 165/122, 124, 126, 80.3, 185; 257/706, 707, 712, 713, 721, 722, 718, 719, 727

[56] References Cited

U.S. PATENT DOCUMENTS

| | | | |
|---|---|---|---|
| 4,277,816 | 7/1981 | Dunn | 361/384 |
| 4,768,581 | 9/1988 | Gotwald | 165/80.3 |
| 5,218,513 | 6/1993 | Brown | 361/694 |
| 5,253,613 | 10/1993 | Bailey | 123/41.31 |
| 5,335,722 | 8/1994 | Wu | 165/122 |
| 5,430,610 | 7/1995 | Hung | 361/697 |

Primary Examiner—Gerald P. Tolin
Attorney, Agent, or Firm—Blakely, Sokoloff, Taylor & Zafman

[57] ABSTRACT

A module which has an integral blower that cools an integrated circuit package. The blower is attached to a heat sink that is mounted to the integrated circuit package. Heat generated by the integrated circuit conducts to the heat sink. The blower generates a stream of air that flows across the heat sink and removes heat from the package. The module may have a manifold and duct that direct the airstream across the heat sink.

9 Claims, 2 Drawing Sheets

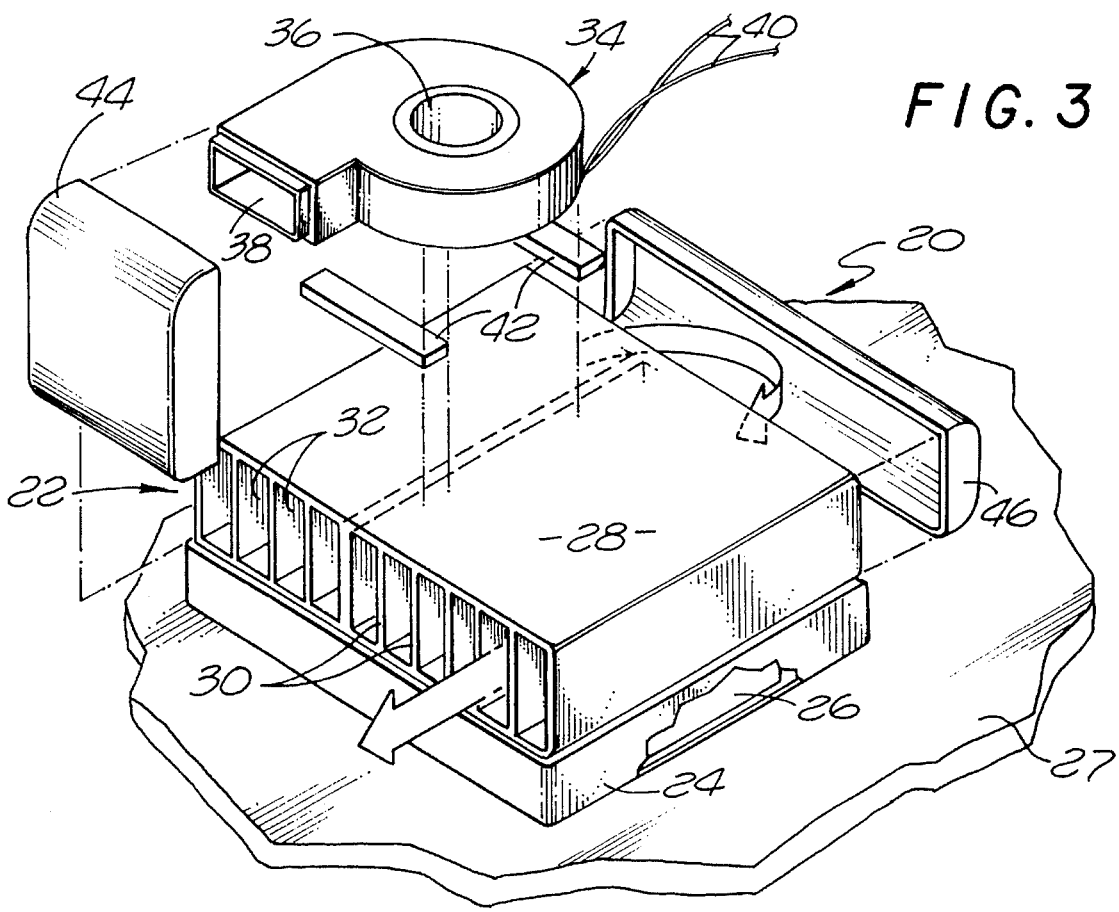
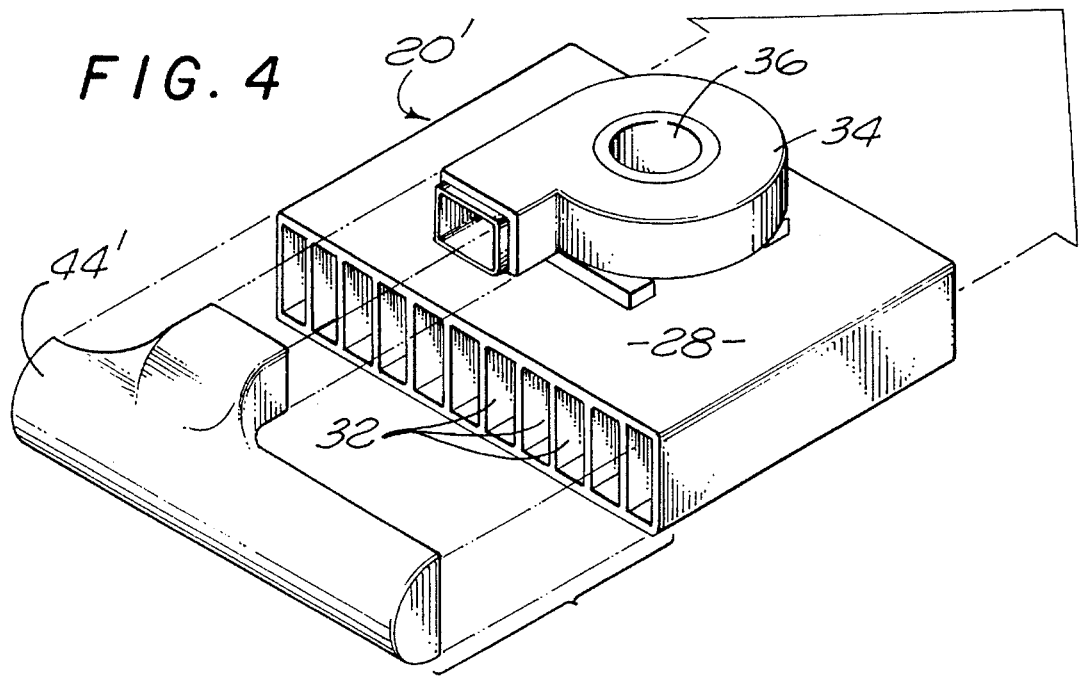

INTEGRATED CIRCUIT PACKAGE WITH AN INTEGRAL HEAT SINK AND FAN

BACKGROUND OF THE INVENTION

1. Field of the Invention

The present invention relates to an integrated circuit package.

2. Description of Related Art

Integrated circuits (ICs) are typically housed within packages that are mounted to a printed circuit board. The printed circuit board assembly is typically located within the inner cavity of a computer housing. In operation, integrated circuits generate heat which can raise the temperature of the circuit. To avoid circuit failure, it is desirable to maintain the junction temperature of the integrated circuit below a predetermined value. For this reason it is desirable to remove the heat from the circuit and the IC package.

FIG. 1 shows a typical computer housing which has a fan 10 mounted to a front panel of the housing 12. The fan 10 generates a stream of air that flows across the integrated circuit packages 14. The airstream increases the heat transfer rate from the packages and removes the heat generated by the integrated circuits. The flow impedance of air flow through the chassis produces a large pressure drop and a corresponding reduction of the airstream flowrate, thereby reducing the effectiveness of the fan. It would be desirable to provide a more thermally efficient system for cooling integrated circuit packages, particularly packages which generate a significant amount of heat such as a microprocessor. Heatsinks using integral axially-directed fans are also currently used. This configuration is relatively inefficient due to the creation of a static air zone directly below the fan rotor. Moreover, attempts to increase heat transfer efficiency via more convoluted fin patterns are limited by the low air pressure that axial fans can produce.

SUMMARY OF THE INVENTION

The present invention is a module which has an integral blower that cools an integrated circuit package. The blower is attached to a heat sink that is mounted to the integrated circuit package. Heat generated by the integrated circuit conducts to the heat sink. The blower generates a stream of air that flows across the heat sink and removes heat from the package. The module may have a manifold and a duct that directs the airstream across the heat sink.

BRIEF DESCRIPTION OF THE DRAWINGS

The objects and advantages of the present invention will become more readily apparent to those ordinarily skilled in the art after reviewing the following detailed description and accompanying drawings, wherein:

FIG. 3 is an exploded view of the integrated circuit module;

FIG. 4 is an alternate embodiment of the integrated circuit module.

DETAILED DESCRIPTION OF THE INVENTION

Figure 1:
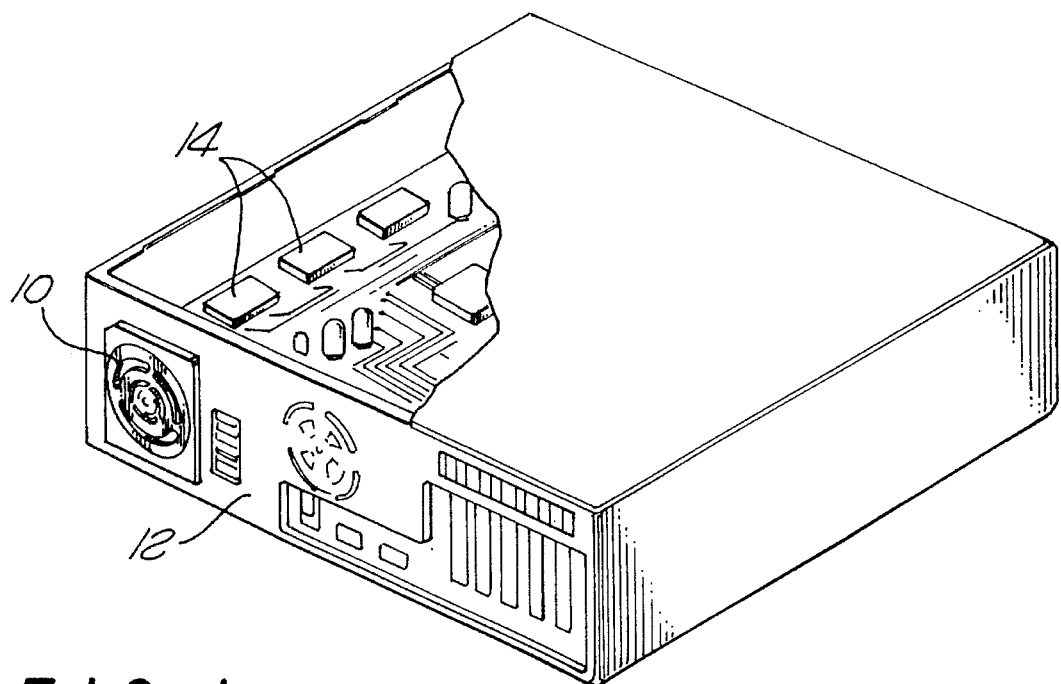
FIG. 1 is a perspective view of a computer housing of the prior art showing a fan that cools a plurality of integrated circuit packages.
Figure 2:
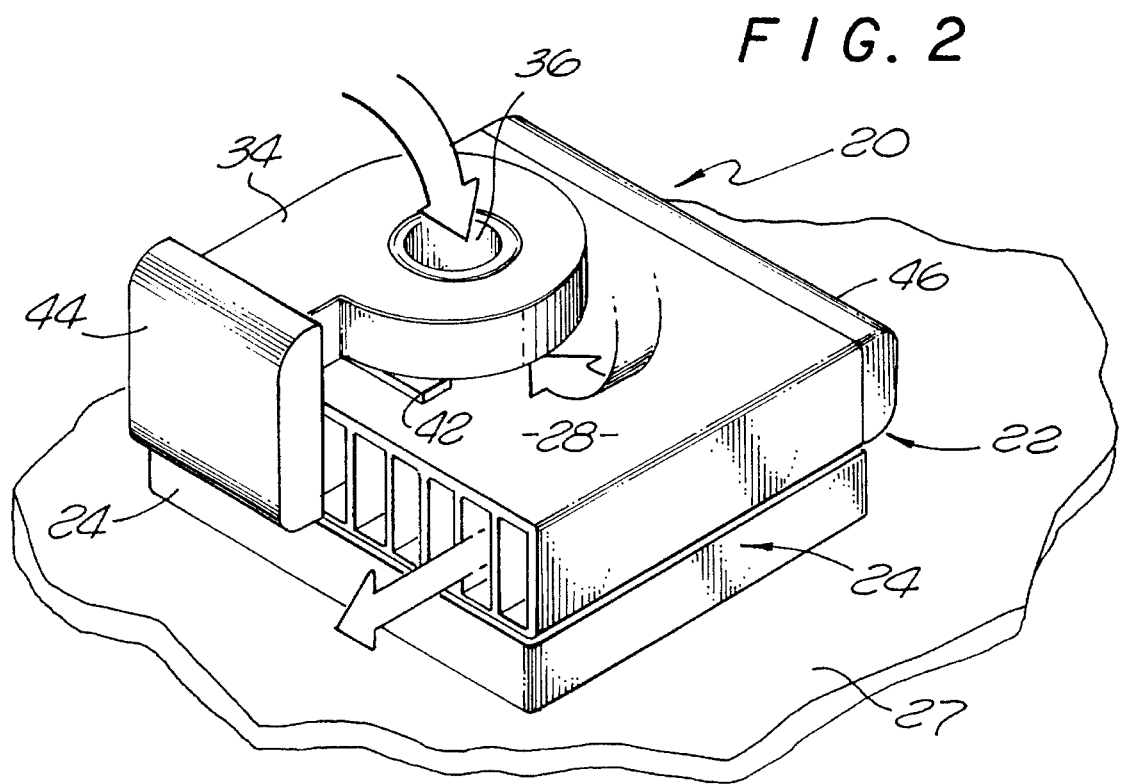
FIG. 2 is a perspective view of a integrated circuit module of the present invention.

Referring to the drawings more particularly by reference numbers, FIGS. 2 and 3 show a module 20 of the present invention. The module 20 includes a cooling subsystem 22 that is mounted to an integrated circuit package 24. The package 24 typically contains an integrated circuit 26, although it is to be understood that the package 24 may contain other electronic devices. The package 24 is typically constructed from a plastic or ceramic material and has an interface that is coupled to a printed circuit board 27. The interface may contain gull-wing leads (Quad Flat Pack), a pin grid array (PGA), a ball grid array (BGA), pin and socket or any other type of electrical/mechanical interface with the circuit board 27. Although specific package types have been described, it is to be understood that the cooling subsystem 22 can be used with any type of integrated circuit package.

The cooling subsystem 22 includes a heat sink 28 which is attached to the top surface of the package 24. The heat sink 28 typically has a plurality of walls 30 separated by a plurality of channels 32. In the preferred embodiment, the heat sink 28 has 18 walls approximately 0.06 inches thick, separated by 17 channels approximately 0.09 inches wide. The channels 32 are preferably 2.5 inches long and the heat sink is preferably 1.2 inches in height. The heat sink 28 is typically constructed from a thermally conductive material such as aluminum or copper. The heat generated by the integrated circuit 26 conducts through the package 24 and into the heat sink 28. To reduce the thermal resistance through the package 24, the package 24 may have a metal heat slug (not shown) embedded therein that provides a direct thermal path between the integrated circuit 26 and the heat sink 28. To further improve the thermal performance of the module 20, the heat sink 28 may be attached to the package 24 with a thermal epoxy, grease or high thermal conductivity interface material.

Mounted to the heat sink 28 is a blower 34 which has an air intake port 36 and an exhaust port 38. The blower 34 also has a pair of wires 40 that are connected to an external power source. The blower 34 generates a stream of air that flows from the exhaust port 38. In the preferred embodiment, the blower 34 is a radial fan unit sold by Panasonic under part number FAL3. The blower unit 34 is approximately 2 inches wide, 2 inches long and less than 1 inch in height. The blower 34 is thus capable of being mounted to the top of an integrated circuit package. The Panasonic blower unit typically has intake ports 36 on both the top and bottom of the product. To allow air to flow in through the bottom intake port, a pair of spacers 42 can be located between the blower 34 and the heat sink 28. The spacers 42 can be bonded to both the blower 34 and the heat sink 28 by any suitable epoxy or adhesive.

The module 20 may have a manifold 44 that directs the airstream from the blower 34 to one-half of the heat sink channels 32. The module 20 may further have a duct 46 that directs the airstream through the remaining channels 32 of the heat sink 28. The airstream flows through the channels 32 and removes heat from the walls 30 of the heat sink 28. The manifold 44 and duct 46 may be constructed from a plastic molded material to reduce the cost and weight of the module 20.

FIG. 4 shows an alternate embodiment of the module 20', wherein the manifold 44' directs the airstream through all of the heat sink channels 32. The blower 34 is preferably mounted to the heat sink 28 in a center location so that the airstream is equally divided through the channels 32. The embodiment of FIG. 4 provides a more uniform temperature distribution across the package 24.

The present invention provides a module 20 that contains a highly efficient means of cooling an integrated circuit package. The package and wires of the fan may both be detachable from a computer assembly, thereby providing a portable IC/cooling module that can be plugged into a different computer unit.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit module, comprising:

an integrated circuit package that has a top surface;

a heat sink mounted to said top surface of said integrated circuit package, said heat sink having a plurality of channels that each have a longitudinal axis;

a blower that is mounted to said heat sink and which generates an airstream; and, a manifold that is attached to said heat sink and said blower to direct the airstream so that the airstream flows in a direction essentially parallel with said top surface along the entire longitudinal axis of said channels.

2. The module as recited in claim 1, further comprising a return duct that redirects the airstream from said heat sink back through said heat sink.

3. The module as recited in claim 1, further comprising a spacer that separates said blower from said heat sink.

4. An integrated circuit module, comprising:

an integrated circuit package that has a top surface;

an integrated circuit within said integrated circuit package;

a heat sink mounted to said top surface of said integrated circuit package, said heat sink having a plurality of channels that each have a longitudinal axis;

a blower that is mounted to said heat sink and which generates an airstream; and, a manifold that is attached to said heat sink and said blower to direct the airstream so that the airstream flows in a direction essentially parallel with said top surface along the entire longitudinal axis of said channels.

5. The module as recited in claim 4, further comprising a return duct that redirects the airstream from said heat sink back through said heat sink.

6. The module as recited in claim 4, further comprising a spacer that separates said blower from said heat sink.

7. A printed circuit board assembly, comprising:

a printed circuit board;

an integrated circuit package that has a top surface, said integrated circuit package being mounted to said printed circuit board;

an integrated circuit within said integrated circuit package;

a heat sink mounted to said top surface of the integrated circuit package, said heat sink having a plurality of channels that each have a longitudinal axis;

a blower that is mounted to said heat sink and which generates an airstream; and, a manifold that is attached to said heat sink and said blower to direct the airstream so that the airstream flows in a direction essentially parallel with said top surface along the entire longitudinal axis of said channels.

8. The assembly as recited in claim 7, further comprising a return duct that redirects the airstream from said heat sink back through said heat sink.

9. The assembly as recited in claim 8, further comprising a spacer that separates said blower from said heat sink.

* * * * *